(12) United States Patent
Sun

(10) Patent No.: US 8,717,764 B2
(45) Date of Patent: May 6, 2014

(54) ELECTRONIC DEVICE AND FAN MODULE

(75) Inventor: Zheng-Heng Sun, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 125 days.

(21) Appl. No.: 13/450,501

(22) Filed: Apr. 19, 2012

(65) Prior Publication Data

US 2013/0240183 A1  Sep. 19, 2013

(30) Foreign Application Priority Data

Mar. 15, 2012 (CN) .......................... 2012 1 0067919

(51) Int. Cl.
*H05K 7/20* (2006.01)
*H01L 23/467* (2006.01)
*H05K 5/00* (2006.01)
*G01F 1/20* (2006.01)
*F04D 25/00* (2006.01)
*G06F 1/00* (2006.01)

(52) U.S. Cl.
CPC .. *H05K 7/20* (2013.01); *H05K 5/00* (2013.01); *G01F 1/20* (2013.01); *F04D 25/00* (2013.01); *H01L 23/467* (2013.01)
USPC ................. 361/695; 361/679.48; 361/679.49; 361/690; 361/694; 165/121; 165/122; 165/104.33; 415/213.1; 415/118; 415/126; 415/214.1; 248/674; 248/678; 248/220.21; 416/244 R; 454/184

(58) Field of Classification Search
CPC .............. H05K 7/00; H05K 5/00; G01F 1/16; F04D 29/00; F04D 29/66; H01L 23/467
USPC ......... 361/679.46–679.5, 690–697, 688, 689, 361/715, 719–722; 165/80.2, 80.3, 104.33, 165/121–126, 185; 248/674, 678, 220.21; 415/118, 126, 213.1, 214.1; 416/244 R, 416/247 R; 417/360, 423.5–423.15; 454/184

See application file for complete search history.

(56) References Cited

U.S. PATENT DOCUMENTS

| | | | |
|---|---|---|---|
| 6,002,586 A * | 12/1999 | Chen et al. .................... | 361/695 |
| 6,075,698 A * | 6/2000 | Hogan et al. .................. | 361/695 |
| 6,169,656 B1 * | 1/2001 | Pei et al. ....................... | 361/695 |
| 6,175,496 B1 * | 1/2001 | Liu et al. ....................... | 361/695 |
| 6,322,042 B1 * | 11/2001 | Nemec .......................... | 248/694 |
| 6,611,427 B1 * | 8/2003 | Liao .............................. | 361/695 |
| 6,616,525 B1 * | 9/2003 | Giraldo et al. ................ | 454/184 |
| 6,999,313 B2 * | 2/2006 | Shih .............................. | 361/695 |
| 7,009,841 B2 * | 3/2006 | Chen et al. .................... | 361/695 |
| 7,048,498 B2 * | 5/2006 | Kosugi .......................... | 415/118 |
| 7,515,413 B1 * | 4/2009 | Curtis ........................... | 361/695 |
| 7,530,890 B2 * | 5/2009 | Chen ............................. | 454/184 |

(Continued)

*Primary Examiner* — Michail V Datskovskiy
(74) *Attorney, Agent, or Firm* — Novak Druce Connolly Bove + Quigg LLP

(57) ABSTRACT

A fan module is detachably mounted in a chassis. The chassis includes a sidewall defining a locking slot. The fan module includes a bracket including a base plate defining a first through slot, a fan fixed to the base plate, a fan duct fixed to the base plate beside the fan, and a locking member. The fan duct includes a side plate defining a second through slot. The locking member is fixed to the fan duct. The locking member includes a locking portion extending through the second through slot of the fan duct and the first through slot of the bracket to lock into the locking slot of the chassis.

18 Claims, 4 Drawing Sheets

(56) References Cited

U.S. PATENT DOCUMENTS

| | | | |
|---|---|---|---|
| 7,558,061 B2 * | 7/2009 | Franz et al. | 361/695 |
| 7,623,344 B2 * | 11/2009 | Beall et al. | 361/679.48 |
| 8,248,779 B2 * | 8/2012 | Liu | 361/679.4 |
| 8,282,345 B2 * | 10/2012 | Fan et al. | 415/119 |
| 8,405,989 B2 * | 3/2013 | Wang | 361/695 |
| 8,503,177 B2 * | 8/2013 | Chiu | 361/695 |
| 2002/0094283 A1 * | 7/2002 | Salmen et al. | 417/360 |
| 2006/0023419 A1 * | 2/2006 | Kao et al. | 361/690 |
| 2013/0127311 A1 * | 5/2013 | Chiu et al. | 312/236 |
| 2013/0149168 A1 * | 6/2013 | Sun | 416/244 R |

\* cited by examiner

_US 8,717,764 B2_

ELECTRONIC DEVICE AND FAN MODULE

CROSS-REFERENCE OF RELATED APPLICATION

Relevant subject matter is disclosed in a pending U.S. patent application, with application Ser. No. 13/337,263, filed on Dec. 26, 2011, and titled "MOUNTING APPARATUS FOR FAN", which is assigned to the same assignee with this patent application.

BACKGROUND

1. Technical Field

The present disclosure relates to an electronic device with a fan module.

2. Description of Related Art

An electronic device often uses a fan for heat dissipation. The fan is installed in a case mounted in the electronic device. However, the fan is often fixed to the case through a plurality of screws, which is inconvenient.

BRIEF DESCRIPTION OF THE DRAWINGS

Many aspects of the present embodiments can be better understood with reference to the following drawings. The components in the drawing are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

Figure 1:
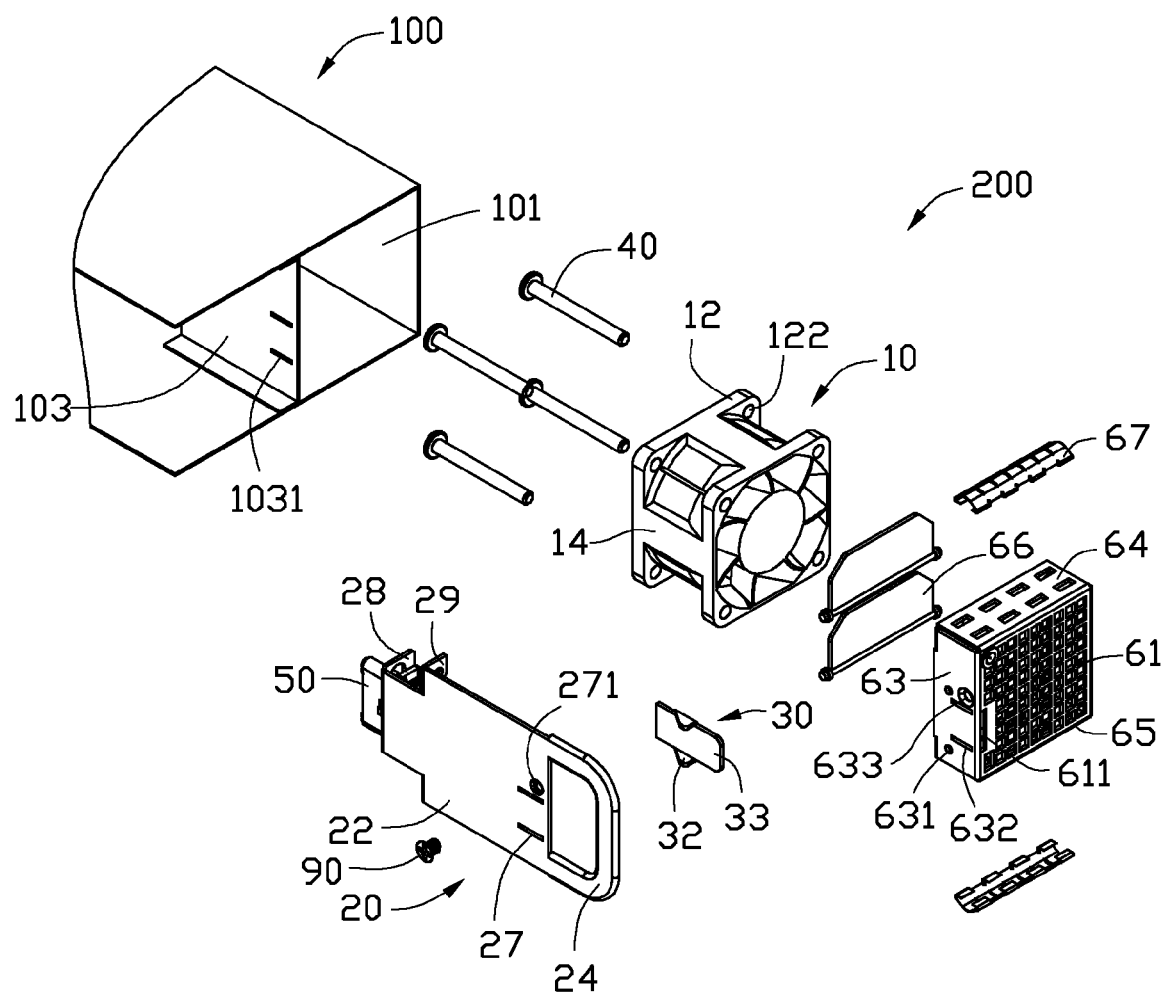
FIG. 1 is an exploded, isometric view of an electronic device in accordance with an exemplary embodiment, wherein the electronic device includes a fan module.
Figure 2:
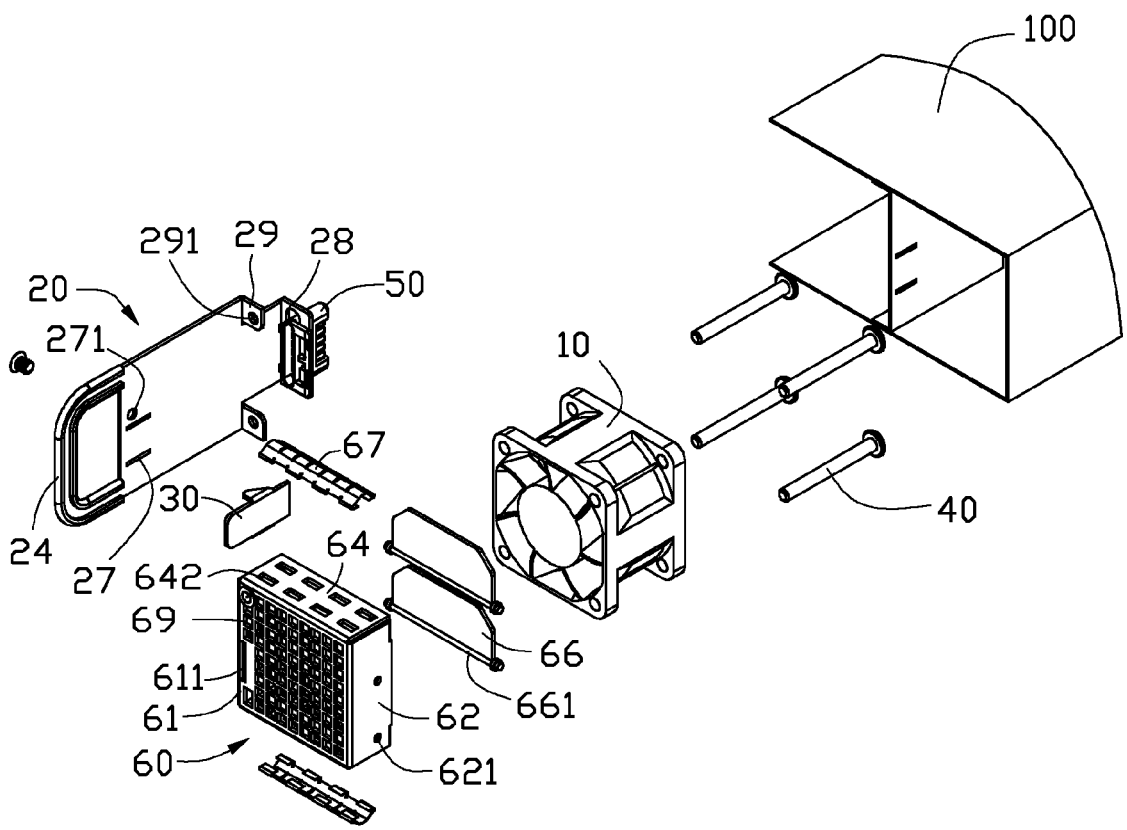
FIG. 2 is similar to FIG. 1, but viewed from another aspect.

FIG. 1 and FIG. 2, show an embodiment of an electronic device including a chassis 100 and a fan module 200 received in the chassis 100.

The chassis 100 includes a receiving portion 101 for receiving the fan module 200. The receiving portion 101 includes a sidewall 103 defining two parallel locking slots 1031.

The fan module 200 includes a fan 10, a bracket 20, a locking member 30, four fasteners 40, and a fan duct 60. In this embodiment, the fasteners 40 are bolts.

The fan 10 includes two mounting plates 12 each defining four mounting holes 122 in four corners. An engaging portion 14 is formed on the fan 10, between every two opposite sides of the mounting plates 12.

The bracket 20 includes a base plate 22. A handle 24 is formed from a first end of the base plate 22. Two through slots 27 are defined in the base plate 22, near the handle 24. A through hole 271 is defined in the base plate 22 above the through slots 27, near the handle 24. A clipping portion 28 perpendicularly extends from a middle of a second end of the base plate 22. A connector 50, extending away from the handle 24, is fixed to the clipping portion 28. Two fixing pieces 29 extend perpendicularly from the second end of the base plate 22, at opposite sides of the clipping portion 28. Each fixing piece 29 defines a fixing hole 291.

The locking member 30 includes two triangular locking portions 32 extending from opposite sides of the locking member 30, and an operation portion 33 extending from one end of the locking member 30.

Figure 3:
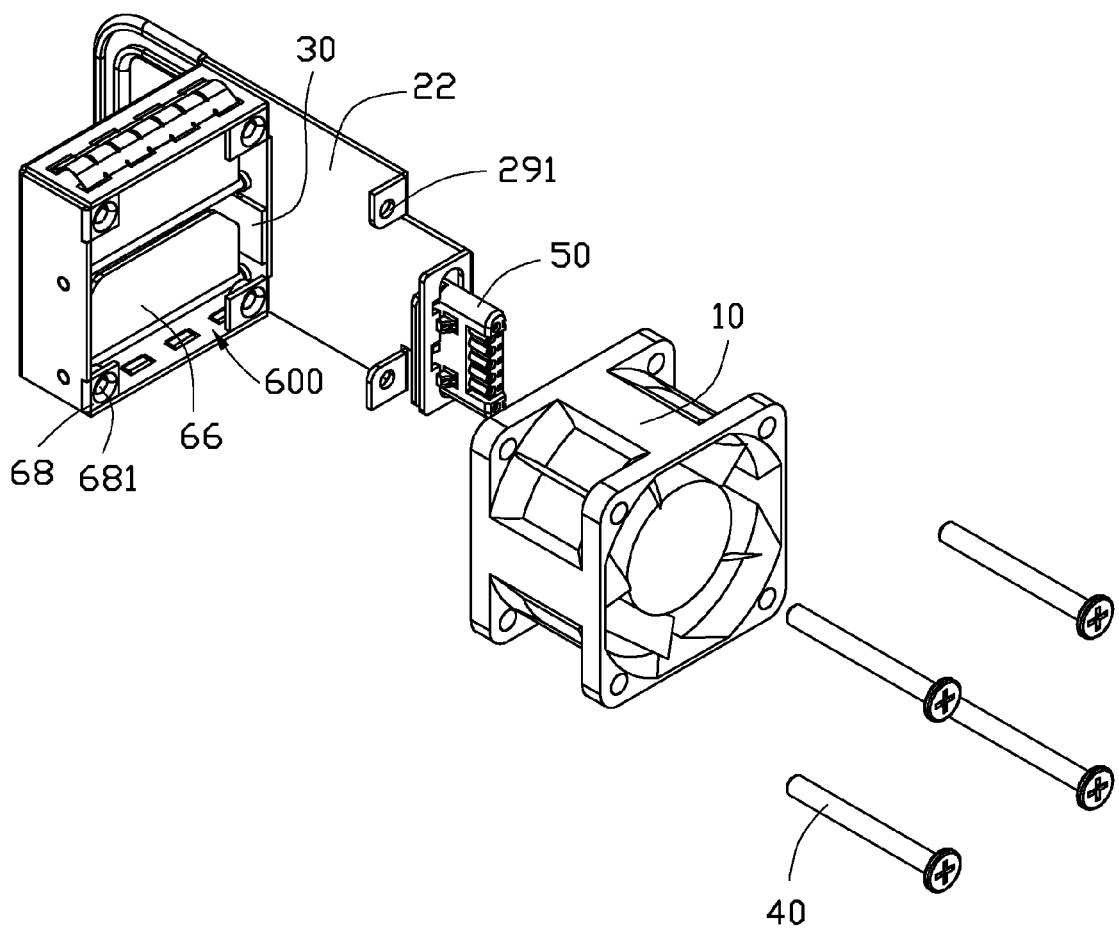
FIG. 3 is a partially assembled, isometric view of the fan module of FIG. 2, but viewed from another aspect.

FIG. 3, shows the fan duct 60 including a substantially box-shaped main body, two blocking plates 66 pivotably mounted to the main body, and two resilient metal pieces 67. The main body includes a side plate 61, a left plate 62, a right plate 63, a top plate 64, and a bottom plate 65. An opening 600 is defined in a side of the main body 60 opposite to the side plate 61. The side plate 61 defines a plurality of vents 69 and an elongated slot 611 near the right plate 63. The left plate 62 defines two pivot holes 621 arranged from up to down. The right plate 63 defines two pivot holes 631, corresponding to the pivot holes 621. The right plate 63 further defines two parallel through slots 632 near the pivot holes 621, and a mounting hole 633 above the through slots 632. Each blocking plate 66 includes two pins 661 extending from opposite ends of a side of the blocking plate 66. The pins 661 of each blocking plate 66 pivotably engage in the corresponding pivot holes 621 and 631. The top plate 64 and the bottom plate 65 each define a plurality of locking holes 642 for attaching a corresponding metal resilient piece 67, for shielding electromagnetic radial (EMR). The fan duct 60 has four mounting pieces 68 formed at the four corners near the opening 600. Each mounting piece 68 defines a mounting hole 681.

Figure 4:
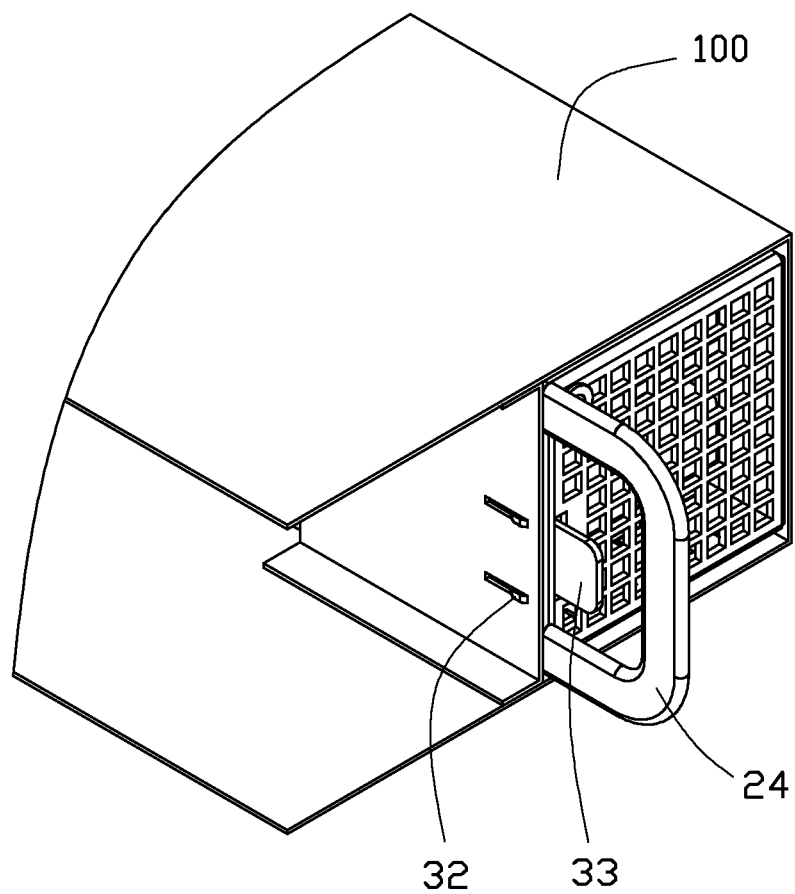
FIG. 4 is an assembled, isometric view of the electronic device of FIG. 1.

FIG. 4, shows in assembling of the fan module 200, the operation portion 33 extends through the elongated slot 611 through the opening 600, the end of the locking member 30 away from the operation portion 33 is fixed to an inner side of the right plate 63 through screwing, riveting, or welding. The locking portions 32 extend through the through slots 632. A screw 90 extends through the through hole 271 to screw into the mounting hole 633, to mount the fan duct 30 to a side of the bracket 20. The locking portions 32 extend through the corresponding through slots 27.

The fan 10 is attached to the bracket 20 between the fan duct 60 and the fixing pieces 29, with the mounting plates 12 perpendicular to the base plate 22. One mounting plate 12 abuts against the mounting pieces 29, with two mounting holes 122 adjacent to the bracket 20 aligning with the corresponding fixing holes 291. Two of the fasteners 40 extend through the mounting holes 122 near the bracket 20 and the corresponding fixing holes 291, to screw into the corresponding mounting holes 681 near the bracket 20. The other two fasteners 40 extend through the mounting holes 122 in a position away from the bracket 20, to screw into the corresponding mounting holes 681. Therefore, the fan 10 is fixed to the bracket 20. One of the engaging portions 14 abuts against the base plate 22. A width of the elongated slot 611 is enough for deforming the locking member 30 to release the locking portions 32 from the locking slots 1031. The connector (not shown) of the fan 10 is connected to the connector 50.

When assembling the fan module 200 to the receiving portion 101, the locking portions 32 abut against the sidewall 103 to deform the locking member 30 away from the sidewall 103. When the locking portions 32 align with the corresponding locking slots 1031, the locking member 30 is restored to persuade the locking portions 32 to engage in the corresponding locking slots 1031. The connector 50 is connected to a circuit board (not shown) in the chassis 100.

In disassembling the fan module 200, the operation portion 33 is manipulated away from the sidewall 103 to deform the locking member 30, until the locking portions 32 are released from the locking slots 1031. The handle 24 is manipulated to draw the fan module 200 out. Therefore, the fan module 200 can be pulled out of the chassis 100.

In this embodiment, the fan duct 60 with the metal pieces 67 can shield EMR. The blocking plates 66 are rotated to open the opening 600, when the fan 10 is operating. The blocking plates 66 are rotated to cover the opening 600 when the fan 10 stops operating, which can stop the airflow in the chassis 100 from being unfavorably altered.

Even though numerous characteristics and advantages of the embodiments have been set forth in the foregoing description, together with details of the structure and function of the embodiments, the disclosure is illustrative only, and changes may be made in detail, especially in the matters of shape, size, and arrangement of parts within the principles of the present disclosure to the full extent indicated by the broad general meaning of the terms in which the appended claims are expressed.

What is claimed is:

1. A fan module to be detachably mounted in a chassis with a sidewall defining a locking slot, the fan module comprising:
    a bracket comprising a base plate defining a first through slot;
    a fan fixed to the base plate;
    a fan duct fixed to the base plate beside the fan, the fan duct comprising a first end plate defining a second through slot; and
    a locking member attached to the fan duct and comprising a locking portion, wherein the locking portion extending through the second through slot of the fan duct and the first through slot of the bracket to lock into the locking slot of the chassis, and the locking member is operable to be deformed away from the locking slot of the chassis such that the locking portion disengages from the locking slot of the chassis, thus releasing the fan module from the chassis.

2. The fan module as claimed in claim 1, wherein the base plate of the bracket defines a through hole, a screw extends through the through hole of the bracket to screw into the fan duct, to mount the fan duct to the base plate.

3. The fan module as claimed in claim 2, wherein a handle is formed from an end of the base plate, to extend out of the chassis.

4. The fan module as claimed in claim 2, wherein a clipping portion extends in a substantially perpendicular manner from a middle of one end of the base plate, a connector is fixed to the clipping portion for connecting the fan.

5. The fan module as claimed in claim 2, wherein two fixing pieces extend perpendicularly from one end of the base plate, each of the fixing pieces defines a fixing hole, the fan comprises two mounting plates each defining four mounting holes in four corners, two fasteners extend through two of the fixing holes adjacent to the bracket and the mounting holes of the fan adjacent to the bracket, to screw into the fan duct.

6. The fan module as claimed in claim 1, wherein the fan duct is substantially box-shaped, and defines an opening in a side of the fan duct, the fan duct comprises a side plate opposite to the opening, a left plate, a right plate, a top plate, and a bottom plate, the end plate defines a plurality of vents, and an elongated slot near the right plate, the right plate is attached to the base plate, the locking member comprises an operation portion extending from the locking member opposite to the locking portion, the operation portion extends through the elongated slot for deforming the locking member.

7. The fan module as claimed in claim 6, wherein the left plate defines two first pivot holes arranged from up to bottom, the right plate defines two second pivot holes corresponding to the first pivot holes, the fan duct further comprises two blocking plates, each blocking plate comprises two pins extending from opposite ends of a side of the blocking plate, the pins of each blocking plate pivotably engage in the corresponding first and second pivot holes, to pivotably mount the blocking plate to the fan duct, thereby covering or uncovering the opening of the fan duct.

8. The fan module as claimed in claim 6, wherein the top plate and the bottom plate each define a plurality of locking holes for attaching a resilient metal piece for shielding electromagnetic radial.

9. The fan module as claimed in claim 6, wherein the fan duct forms four mounting pieces at four corner near the opening, each mounting piece defines a mounting hole, two fixing pieces extend perpendicularly from one end of the base plate, each of the fixing pieces defines a fixing hole, the fan comprises two mounting plates each defining four mounting holes in four corners, two fasteners extend through two of the fixing holes adjacent to the bracket and the mounting holes of the fan adjacent to the bracket, to screw into the mounting holes of the mounting pieces of the fan duct adjacent to the bracket.

10. An electronic device, comprising:
    a chassis comprising a receiving portion, the receiving portion comprising a sidewall defining a locking slot;
    a bracket comprising a base plate defining a first through slot;
    a fan fixed to the base plate;
    a fan duct fixed to the base plate beside the fan, the fan duct comprising a side plate defining a second through slot; and
    a locking member attached to the fan duct and comprising a locking portion, wherein the locking portion extending through the second through slot of the fan duct and the first through slot of the bracket to lock into the locking slot of the chassis, and the locking member is operable to be deformed away from the locking slot of the chassis such that the locking portion disengages from the locking slot of the chassis, thus releasing the fan module from the chassis.

11. The electronic device as claimed in claim 10, wherein the base plate of the bracket defines a through hole, a screw extends through the through hole of the bracket to screw into the fan duct, to mount the fan duct to the base plate.

12. The electronic device as claimed in claim 11, wherein a handle is formed from a first end of the base plate, and extends out of the receiving portion.

13. The electronic device as claimed in claim 12, wherein a clipping portion extends in a substantially perpendicular manner from a middle of one end of the base plate, a connector is fixed to the clipping portion for connecting the fan.

14. The electronic device as claimed in claim 11, wherein two fixing pieces extend perpendicularly from one end of the base plate, each of the fixing pieces defines a fixing hole, the fan comprises two mounting plates each defining four mounting holes in four corners, two fasteners extend through two of the fixing holes adjacent to the bracket and the mounting holes of the fan adjacent to the bracket, to screw into the fan duct.

15. The electronic device as claimed in claim 10, wherein the fan duct is substantially box-shaped, and defines an opening in a side, the fan duct comprises a side plate opposite to the opening, a left plate, a right plate, a top plate, and a bottom plate, the end plate defines a plurality of vents, and an elongated slot near the right plate, the right plate is attached to the base plate, the locking member comprises an operation portion extending from the locking member opposite to the locking portion, the operation portion extends through the elongated slot.

16. The electronic device as claimed in claim 15, wherein the left plate defines two first pivot holes arranged from up to bottom, the right plate defines two second pivot holes corresponding to the first pivot holes, the fan duct further comprises two blocking plates, each blocking plate comprises two pins extending from opposite ends of a side of the blocking plate, the pins of each blocking plate pivotably engage in the corresponding first and second pivot holes, to pivotably mount the blocking plate to the fan duct, thereby covering or uncovering the opening of the fan duct.

17. The electronic device as claimed in claim 15, wherein the top plate and the bottom plate each define a plurality of locking holes for attaching a resilient metal piece for shielding electromagnetic radial.

18. The electronic device as claimed in claim 15, wherein the fan duct forms four mounting pieces at four corner near the opening, each mounting piece defines a mounting hole, two fixing pieces extend perpendicularly from one end of the base plate, each of the fixing pieces defines a fixing hole, the fan comprises two mounting plates each defining four mounting holes in four corners, two fasteners extend through two of the fixing holes adjacent to the bracket and the mounting holes of the fan adjacent to the bracket, to screw into the mounting holes of the mounting pieces of the fan duct adjacent to the bracket.

\* \* \* \* \*